US009798308B2

(12) United States Patent
Mimura

(10) Patent No.: US 9,798,308 B2
(45) Date of Patent: Oct. 24, 2017

(54) TEMPERATURE CONTROLLER FOR SEMICONDUCTOR WAFER AND TEMPERATURE CONTROL METHOD FOR SEMICONDUCTOR WAFER

(71) Applicant: KELK Ltd., Hiratsuka-shi, Kanagawa (JP)

(72) Inventor: Kazuhiro Mimura, Hiratsuka (JP)

(73) Assignee: KELK Ltd., Hiratsuka-shi, Kanagawa (JP)

( * ) Notice: Subject to any disclaimer, the term of this patent is extended or adjusted under 35 U.S.C. 154(b) by 456 days.

(21) Appl. No.: 14/593,081

(22) Filed: Jan. 9, 2015

(65) Prior Publication Data
US 2015/0212528 A1 Jul. 30, 2015

(30) Foreign Application Priority Data
Jan. 27, 2014 (JP) .................................. 2014-012293

(51) Int. Cl.
G05D 23/00 (2006.01)
G05B 15/02 (2006.01)
H01L 21/67 (2006.01)
G05D 23/19 (2006.01)

(52) U.S. Cl.
CPC ......... G05B 15/02 (2013.01); G05D 23/1934 (2013.01); H01L 21/67248 (2013.01)

(58) Field of Classification Search
CPC .................................................. G05B 15/02
USPC ................................................ 700/275–306
See application file for complete search history.

(56) References Cited

U.S. PATENT DOCUMENTS 5,715,361 A * 2/1998 Moslehi ............... C23C 16/482
                                                                        118/725
6,114,670 A * 9/2000 Erickson .................. G05B 5/01
                                                                        219/490
2002/0143426 A1* 10/2002 Starner .............. G05D 23/1935
                                                                        700/207

(Continued)

FOREIGN PATENT DOCUMENTS

JP 62-129602 8/1987
JP 63-245501 10/1988

(Continued)

OTHER PUBLICATIONS

Choi, Jin Young, and Hyun Min Do. "A learning approach of wafer temperature control in a rapid thermal processing system." IEEE transactions on Semiconductor Manufacturing 14.1 (2001): pp. 1-10.*

(Continued)

*Primary Examiner* — Satish Rampuria
(74) *Attorney, Agent, or Firm* — Fish & Richardson P.C.

(57) ABSTRACT

A temperature controller that performs a temperature control on a plurality of temperature adjusters including a reference temperature adjuster to adjust a temperature of a semiconductor wafer includes a setpoint setting section that: sets a temperature detected by a master temperature detector as a control setpoint for a reference one of the temperature adjusters of a master loop, until a temporary setpoint below an actual control setpoint preset as a desired temperature of the semiconductor wafer is reached; and sets the actual control setpoint as the control setpoint for the master loop after the temporary setpoint is reached.

4 Claims, 14 Drawing Sheets

(56) References Cited

U.S. PATENT DOCUMENTS

2005/0115945 A1\* 6/2005 Kesteren ............ F27B 17/0025
                                                        219/390
2016/0196960 A1\* 7/2016 Goto ...................... G05D 23/19
                                                      156/345.27

FOREIGN PATENT DOCUMENTS

| JP | 01-191901 | 8/1989 |
|----|-----------|--------|
| JP | H07-200076 A | 8/1995 |
| JP | 2000-187514 A | 7/2000 |
| JP | 2001-265447 | 9/2001 |
| JP | 2002-023805 | 1/2002 |
| JP | 3278807 B2 | 4/2002 |
| JP | 2009-015545 | 1/2009 |
| JP | 2014-013607 | 1/2014 |

OTHER PUBLICATIONS

Greene, Lori E., et al. "Low-temperature wafer-scale production of ZnO nanowire arrays." Angewandte Chemie International Edition 42.26 (2003): pp. 3031-3034.\*

Schmidt, Martin A. "Wafer-to-wafer bonding for microstructure formation." Proceedings of the IEEE 86.8 (1998): pp. 1575-1585.\*

Office Action for corresponding Japanese Application No. 2014-012293, dated Aug. 22, 2017, 9 pages, with English translation.

\* cited by examiner

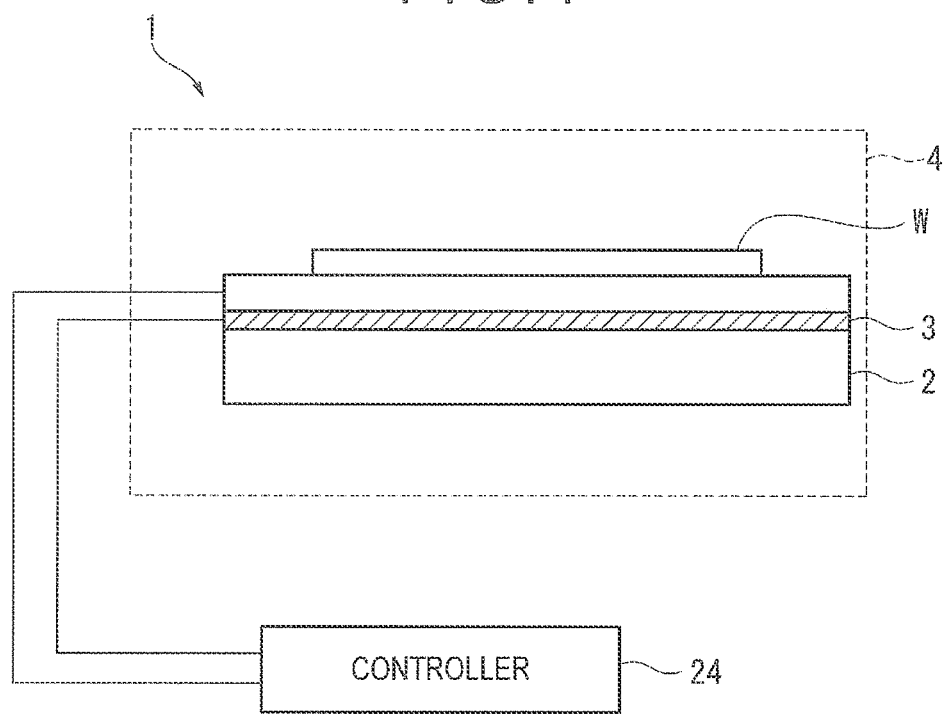

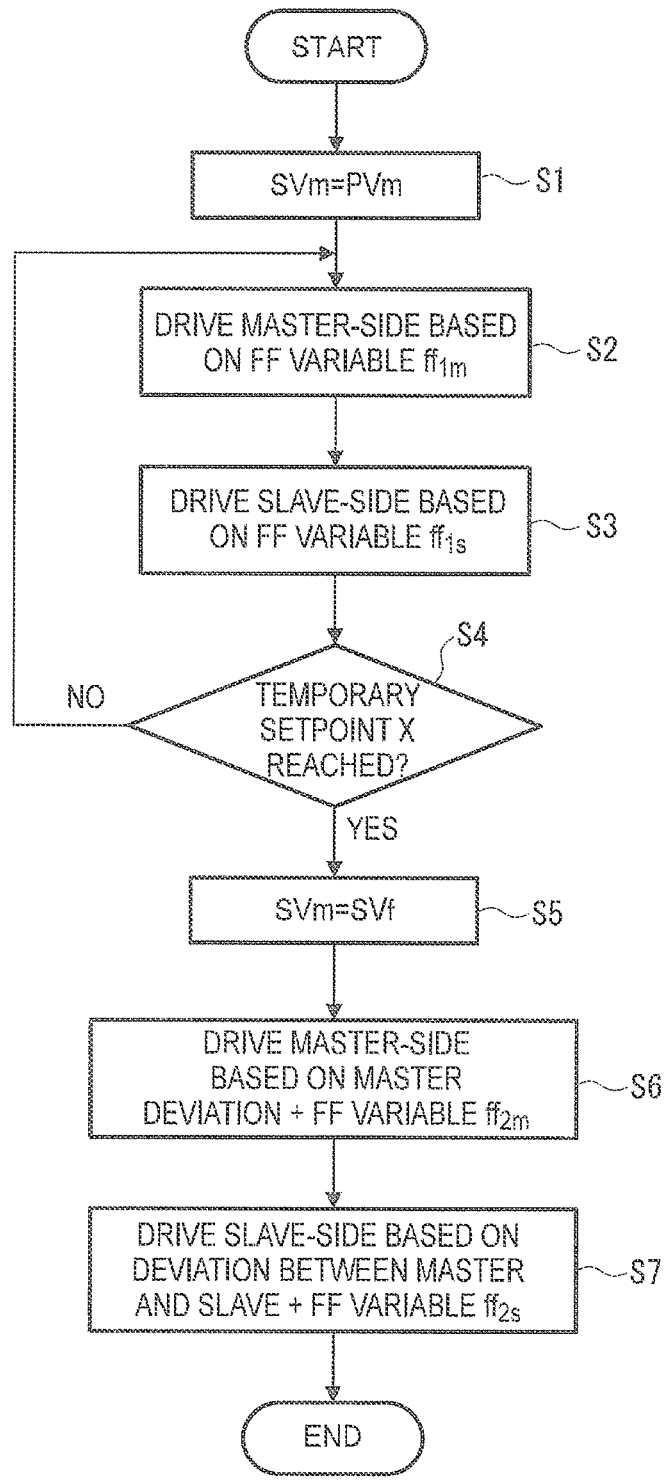

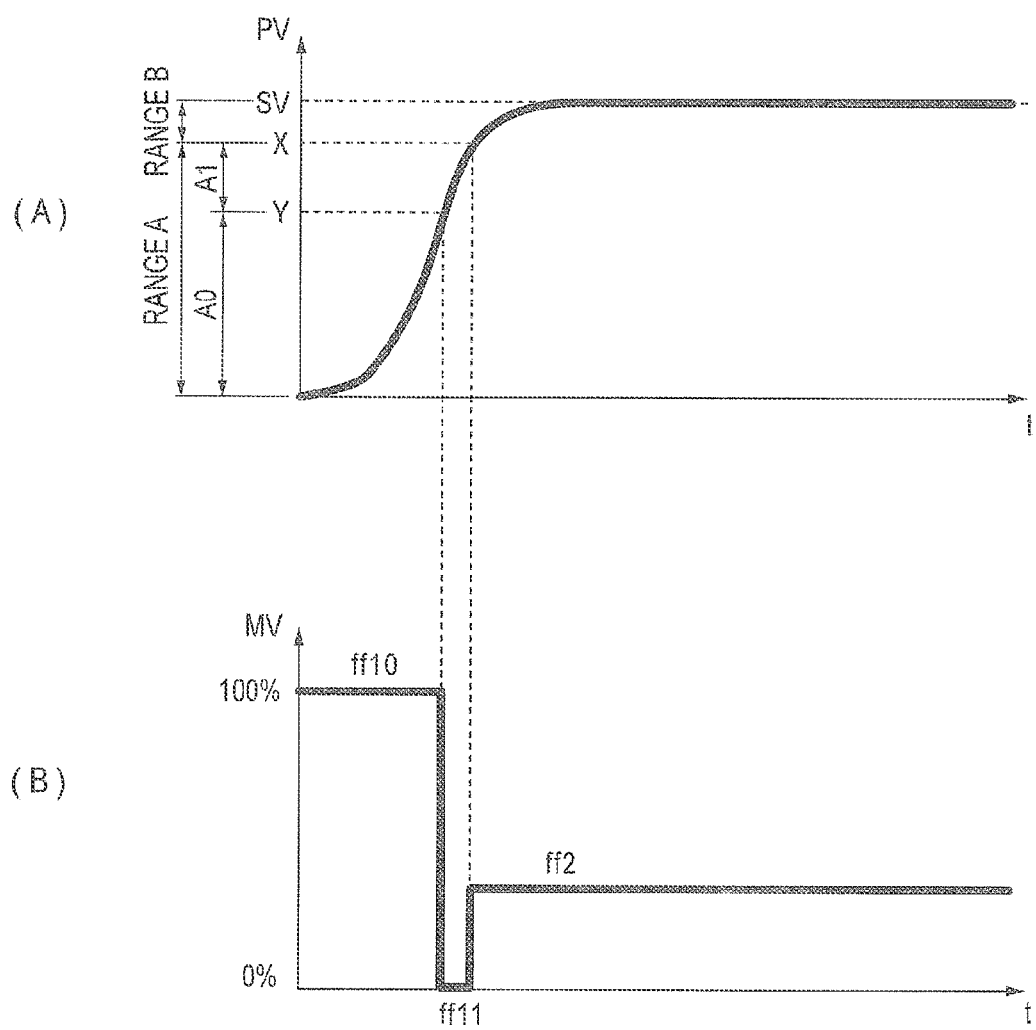

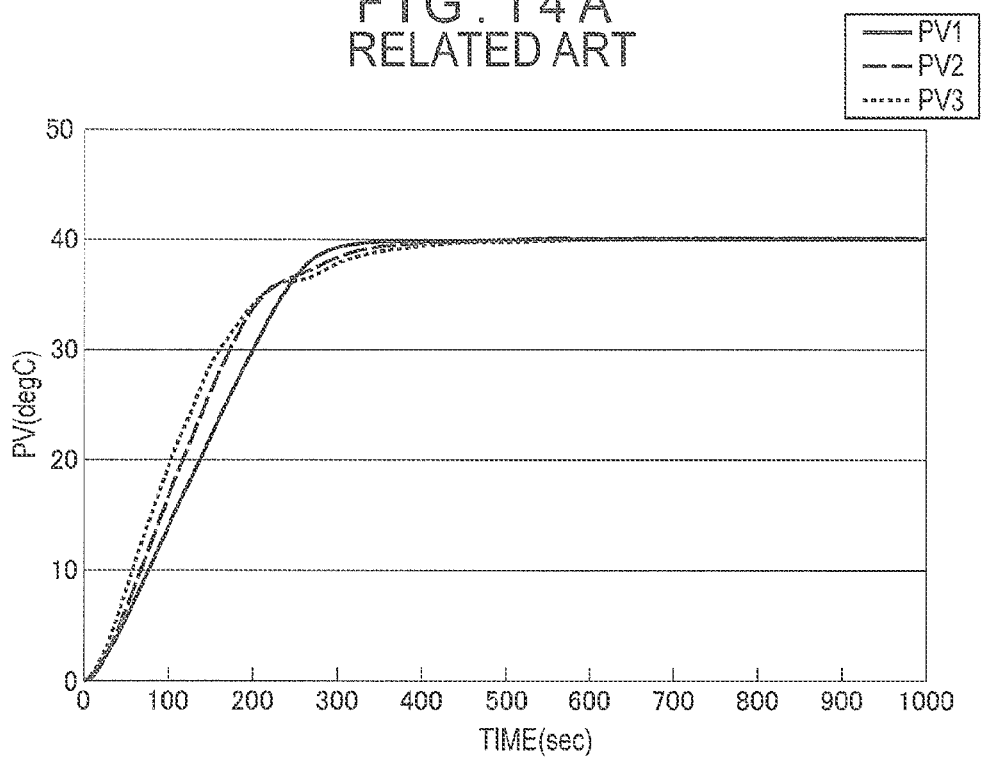
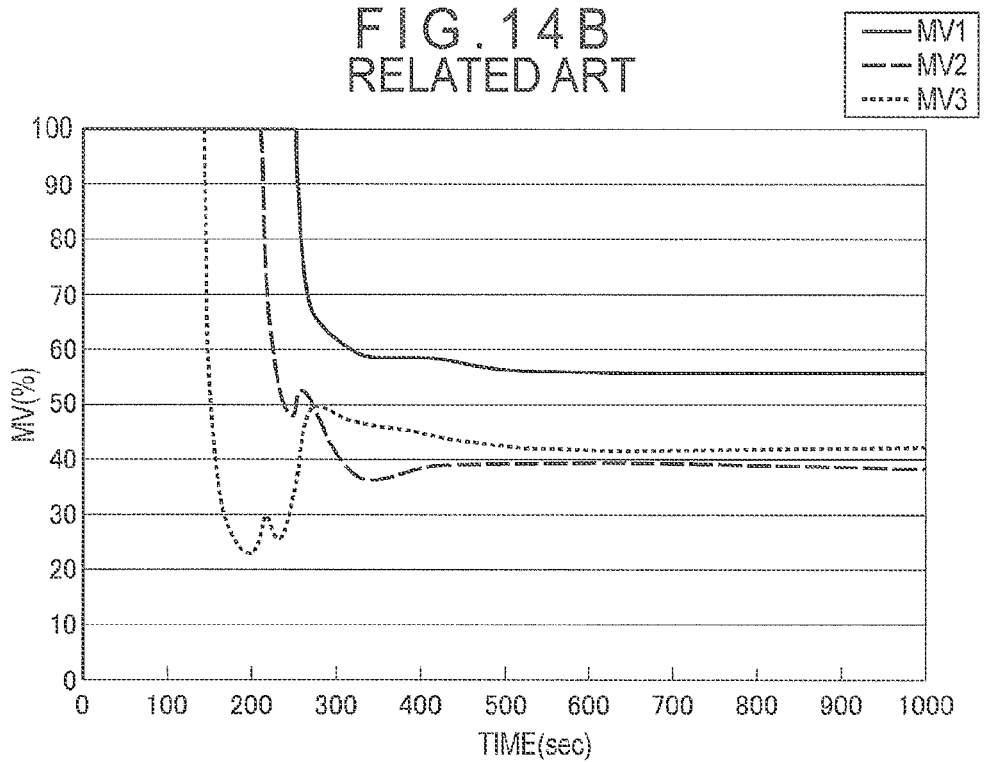

TEMPERATURE CONTROLLER FOR SEMICONDUCTOR WAFER AND TEMPERATURE CONTROL METHOD FOR SEMICONDUCTOR WAFER

The entire disclosure of Japanese Patent Application No. 2014-012293 filed Jan. 27, 2014 is expressly incorporated herein by reference herein.

TECHNICAL FIELD

The present invention relates to a temperature controller for a semiconductor wafer and a temperature control method for a semiconductor wafer that are configured to perform a temperature control on a plurality of temperature adjusters to adjust the temperature of the semiconductor wafer.

BACKGROUND ART

A process for treating a semiconductor wafer such as a silicon wafer includes controlling the in-plane temperature distribution of the silicon wafer as desired while controlling the temperature of the silicon wafer to a temperature setpoint.

For instance, according to a known method, heaters are each incorporated in an independent control loop so that the semiconductor wafer is simultaneously heated using a plurality of temperature adjusters.

Regarding the above temperature control for a semiconductor wafer, it is necessary that control variables should have a constant deviation from a reference control variable until the temperature reaches a setpoint and that the temperature should be maintained at the setpoint irrespective of any disturbance. In connection with the above, a master-slave control method and a gradient temperature control method are typically known (see, for instance, Patent Literature 1: JP-A-7-200076 and Patent Literature 2: JP-A-2000-187514).

In the master-slave control method, one of a plurality of control loops is controlled as a master, and a deviation between a control variable (a setpoint) of the master loop and a control variable of a slave loop(s) is calculated and controlled so that the slave loop(s) follows the behavior of the master loop.

In the gradient temperature control method, an average of control variables for loops is defined as a representative variable, and a difference between the control variables for the loops is defined as a gradient variable (another control variable), the representative variable following a setpoint with the gradient variable being kept constant. The control variables are transformed using a transformation matrix. Further, a non-interfering matrix is used to reduce interference among the loops, and a manipulated variable transformation matrix is used to return the control variables to the original dimension.

However, the techniques disclosed in Patent Literatures 1 and 2 have a problem of lowering a control performance because when the temperature adjusters (an actuator) undergo saturation in the process of responding to the setpoint, further compensation is unavailable.

SUMMARY OF THE INVENTION

An object of the invention is to provide a temperature control system for a semiconductor wafer and a temperature control method for a semiconductor wafer that ensure the following ability and uniformity of control variables among loops and allow temperature adjusters to respond to a setpoint almost at the fastest possible speed.

In a first aspect of the invention, a temperature controller for a semiconductor wafer, the temperature controller being configured to perform a temperature control on a plurality of temperature adjusters including a reference temperature adjuster to adjust a temperature of the semiconductor wafer, includes:

a master loop configured to control a temperature of the reference temperature adjuster;

at least one slave loop configured to follow the master loop to control a temperature of rest of the temperature adjusters;

a master temperature detector configured to detect the temperature of the semiconductor wafer having been adjusted by the reference temperature adjuster;

a slave temperature detector configured to detect the temperature of the semiconductor wafer having been adjusted by the rest of the temperature adjusters; and a manipulated variable calculator configured to calculate, from the temperature detected by the master temperature detector and the temperature detected by the slave temperature detector, a manipulated variable for the reference temperature adjuster and a manipulated variable for the rest of the temperature adjusters, the manipulated variable calculator including:

- a setpoint setting section configured to set, as a control setpoint for the reference temperature adjuster, an actual control setpoint preset as a desired temperature of the semiconductor wafer or a value equal to the temperature detected by the master temperature detector;
- a master deviation calculator configured to calculate a deviation between the control setpoint set by the setpoint setting section and the temperature detected by the master temperature detector;
- a slave deviation calculator configured to calculate a deviation between the temperature detected by the master temperature detector and the temperature detected by the slave temperature detector;
- a master control calculator configured to receive the deviation calculated by the master deviation calculator to calculate the manipulated variable for the reference temperature adjuster;
- a slave control calculator configured to receive the deviation calculated by the slave deviation calculator to calculate the manipulated variable for the rest of the temperature adjusters;
- a manipulated variable converter configured to output the manipulated variable calculated by the master control calculator and the manipulated variable calculated by the slave control calculator respectively to the reference temperature adjuster and the rest of the temperature adjusters after converting the manipulated variable calculated by the master control calculator and the manipulated variable calculated by the slave control calculator so that interference between the master loop and the slave loop is reduced; and
- a feedforward variable adding section configured to add a predetermined feedforward variable corresponding to an output from the manipulated variable converter, in which the setpoint setting section: sets the temperature detected by the master temperature detector as the control setpoint for the reference temperature adjuster, until a temporary setpoint below the actual control setpoint is reached; and sets the actual control setpoint as the control setpoint for the reference temperature adjuster after the temporary setpoint is reached.

In a second aspect of the invention, the temporary setpoint includes a plurality of temporary setpoints.

In a third aspect of the invention, it is determined whether or not the temporary setpoint is reached on a basis of at least one of temperature and time.

In a fourth aspect of the invention, a temperature control method for a semiconductor wafer, the temperature control method being configured to perform a temperature control on a plurality of temperature adjusters including a reference temperature adjuster to adjust a temperature of the semiconductor wafer, the plurality of temperature adjusters being controlled by a temperature control system, the temperature control system including:

a master loop configured to control a temperature of the reference temperature adjuster;

at least one slave loop configured to control a temperature of rest of the temperature adjusters; and a manipulated variable calculator configured to apply a manipulated variable to each of the reference temperature adjuster and the rest of the temperature adjusters, the temperature control method being configured to be performed by the manipulated variable calculator, the temperature control method includes:

setting, as a control setpoint for the master loop, a temperature detection value of the semiconductor wafer having been subjected to a temperature adjustment by the temperature adjusters;

performing the temperature control of the temperature adjusters based on a preset feedforward variable;

determining whether or not a temporary setpoint below an actually preset control setpoint to be finally achieved is reached;

switching the control setpoint for the master loop to the control setpoint to be finally achieved, when the temporary setpoint is determined to be reached; and performing a feedback control in combination with a feedforward control based on a preset feedforward variable.

In the first aspect of the invention, the setpoint setting section: sets a temperature detected by the master temperature detector as a control setpoint for the reference temperature adjuster of the master loop, until a temporary setpoint below an actual control setpoint, which is preset as a desired temperature of the semiconductor wafer, is reached; and sets the actual control setpoint as the control setpoint for the reference temperature adjuster after the temporary setpoint is reached.

Therefore, since the temperature detection value is set as the control setpoint to be achieved until the temporary setpoint is reached, a feedback control of the temperature detection value is cancelled and thus is not performed.

As a result, at the start of the temperature adjustment control, the temperature adjustment can be performed based on the feedforward variable almost at the fastest possible speed of the temperature adjuster of the master loop.

After the temporary setpoint is reached, a typical feedback control is performed in combination with the feedforward control so that the control setpoint is promptly reached.

In the second aspect of the invention, a plurality of temporary setpoints are preset, thereby further minutely determining feedforward variables to achieve a highly accurate temperature control.

In the third aspect of the invention, it is determined whether or not the temporary setpoint is reached on a basis of at least one of temperature and time, thereby achieving a highly accurate temperature adjustment control.

The fourth aspect of the invention can provide effects similar to those of the first aspect.

BRIEF DESCRIPTION OF DRAWING(S)

FIG. 1 is a block diagram showing a temperature adjustment apparatus according to a first exemplary embodiment of the invention.

FIG. 6 is a flow chart for explaining the effects of the first exemplary embodiment.

FIG. 7 is graphs for explaining the effects of a second exemplary embodiment of the invention, showing a relationship between the control variable PV and the manipulated variable MV.

Figure 11:
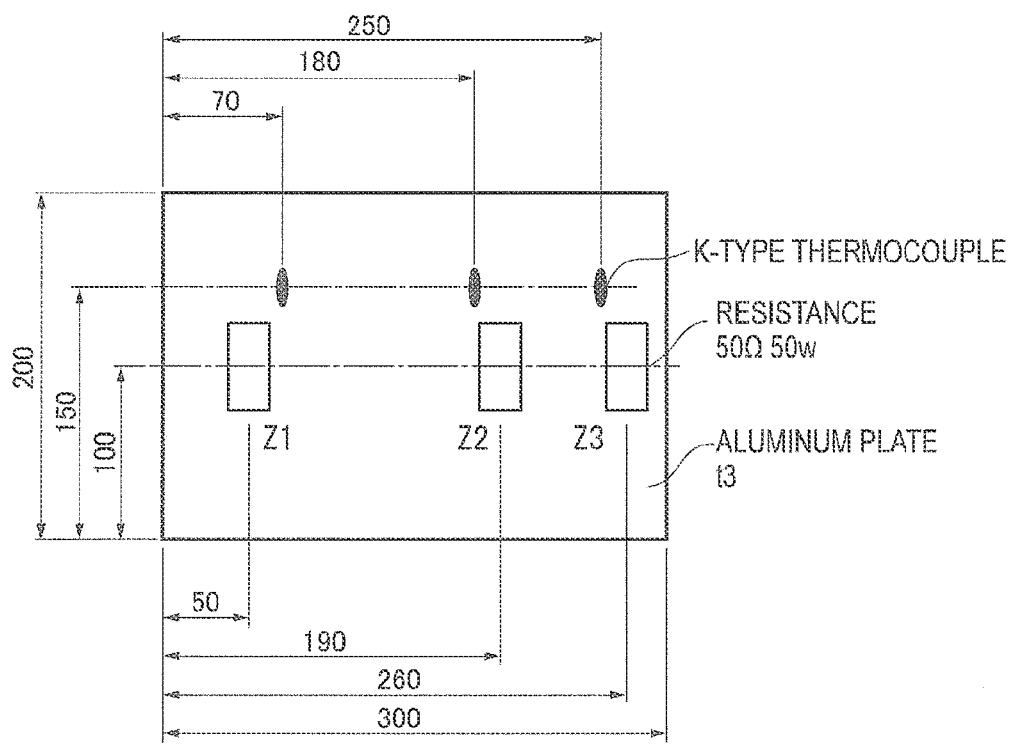

FIG. 11 schematically illustrates a model designed to have interference among temperature adjusters.

Figure 12A:
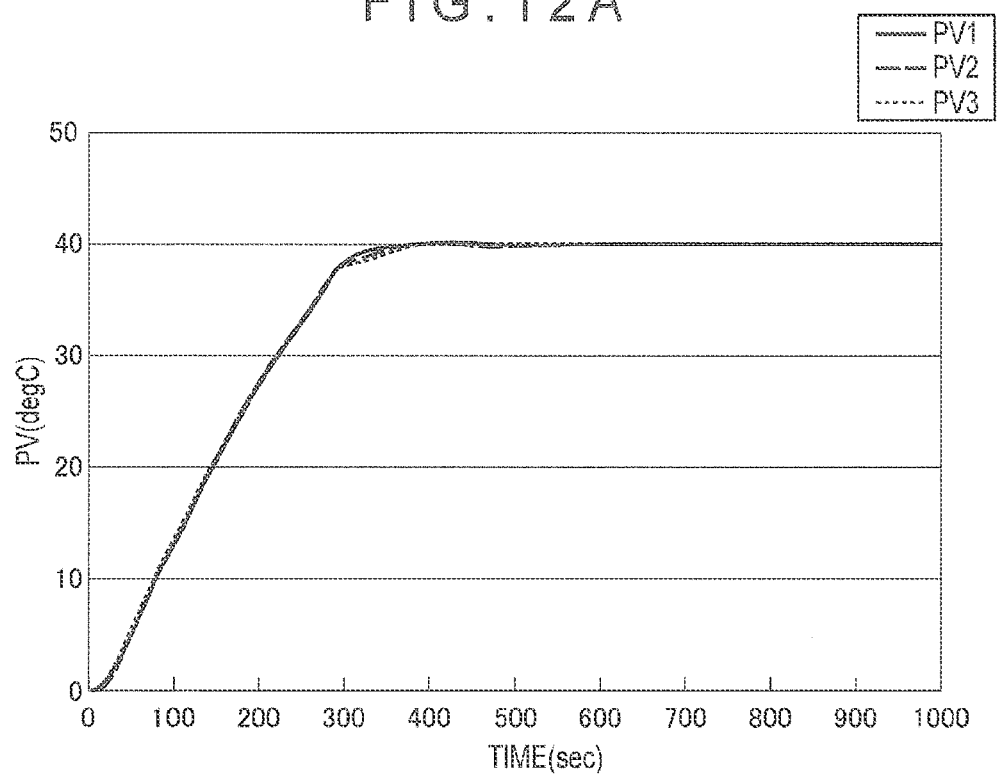

FIG. 12A is a graph for explaining the result of the simulation according to the first exemplary embodiment, showing a variation of the control variable PV (in the case that the target with interference is controlled).

Figure 12B:
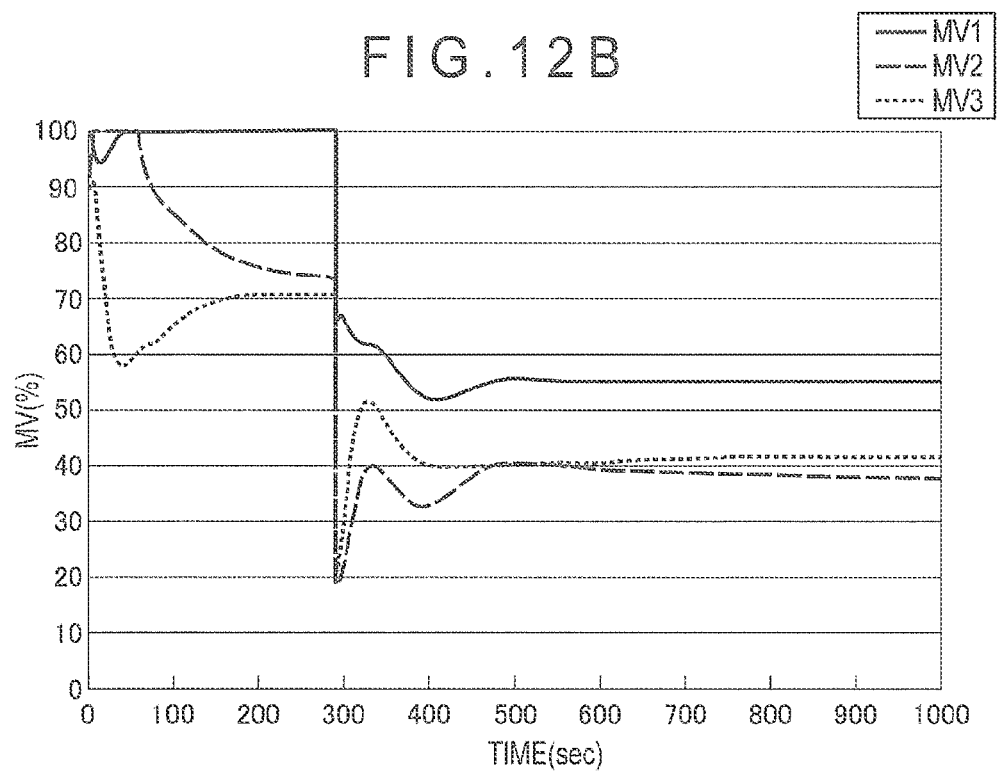

FIG. 12B is a graph for explaining the result of the simulation according to the first exemplary embodiment, showing a variation of the manipulated variable MV (in the case that the target with interference is controlled).

Figure 13A:
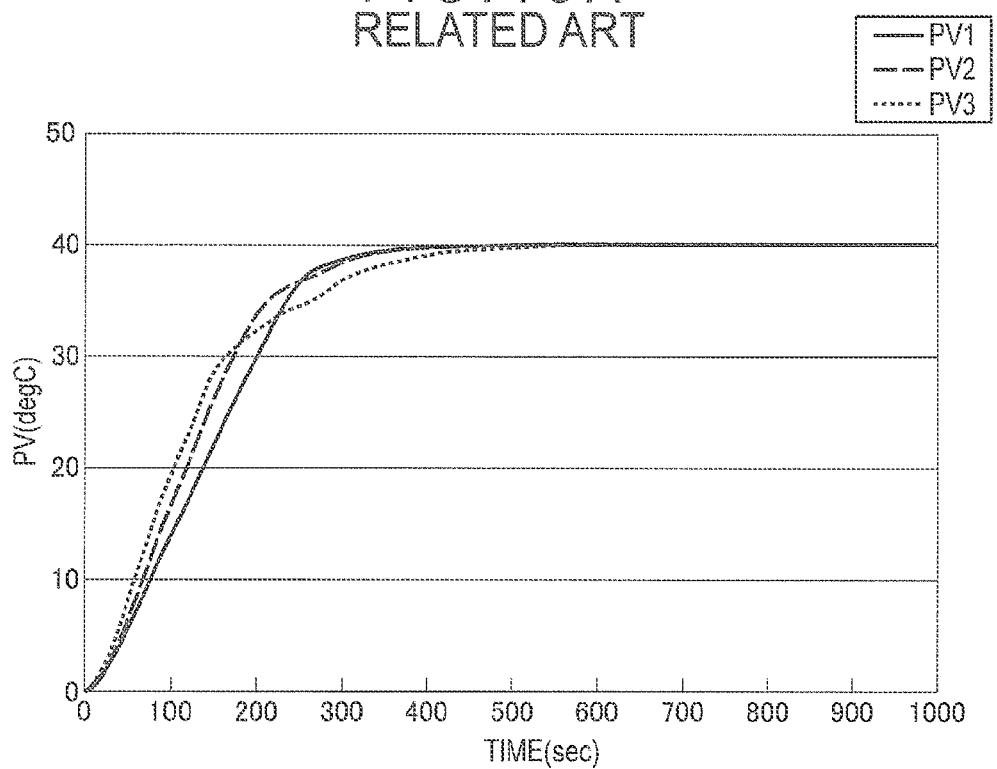

FIG. 13A is a graph for explaining the result of the simulation by the typical method, showing a variation of the control variable PV (in the case that the target with interference is controlled).

Figure 13B:
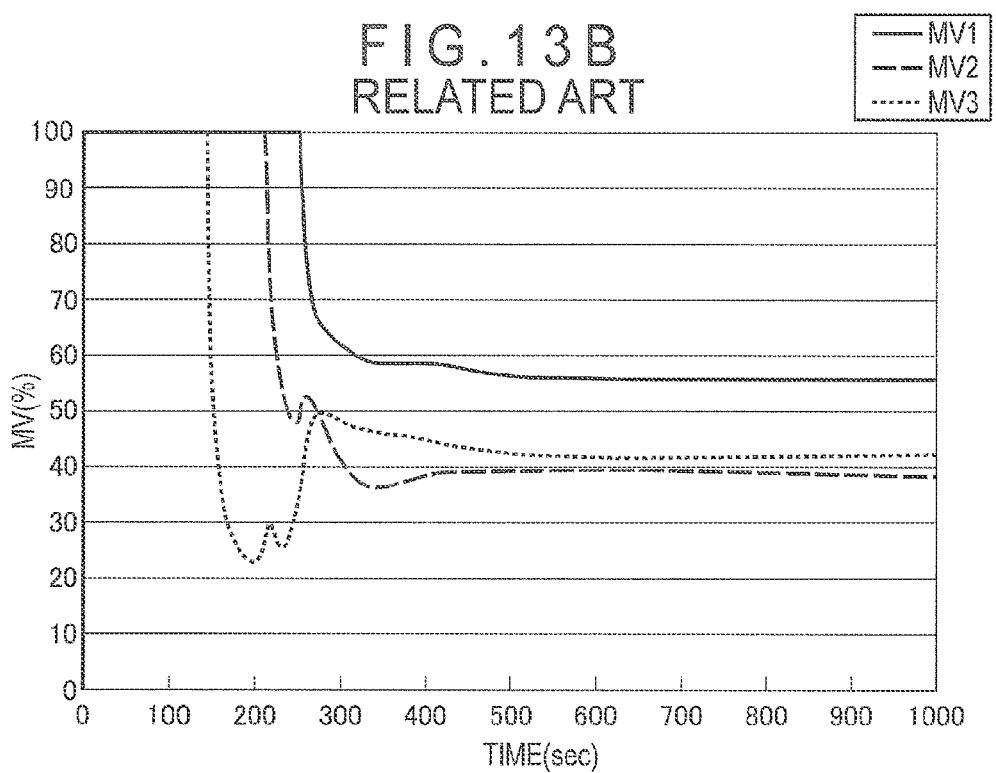

FIG. 13B is a graph for explaining the result of the simulation by the typical method, showing a variation of the manipulated variable MV (in the case that the target with interference is controlled).

FIG. 14A is a graph for explaining the result of the simulation by the typical gradient temperature control method, showing a variation of the control variable PV (in the case that the target with interference is controlled).

FIG. 14B is a graph for explaining the result of the simulation by the typical gradient temperature control method, showing a variation of the manipulated variable MV (in the case that the target with interference is controlled).

DESCRIPTION OF EMBODIMENT(S)

Exemplary embodiment(s) of the invention will be described below with reference to the attached drawings.

[1] Structure of Temperature Adjustment Apparatus 1

FIG. 1 shows a temperature adjustment apparatus 1 according to a first exemplary embodiment of the invention. The temperature adjustment apparatus 1 controls the temperature of a silicon wafer W set on a stage 2 to a temperature setpoint and controls the in-plane temperature distribution of the silicon wafer W. The temperature adjustment apparatus 1 is used, for instance, in a dry process.

The temperature adjustment apparatus 1 includes the stage 2 and a heater 3. It should be noted that the stage 2, which is heated by the heater 3 in the first exemplary embodiment, may alternatively be heated by a chiller or a thermoelectric element, and a cooling control may be performed in the case of using the chiller or the thermoelectric element.

The stage 2 is disposed in a vacuum chamber 4 and the silicon wafer W is set on the stage 2. The silicon wafer W is electrostatically held on the stage 2. It should be noted that helium gas may be delivered between the stage 2 and the silicon wafer W to enhance efficiency in heat transfer between the stage 2 and the silicon wafer W.

In the dry process, the vacuum chamber 4 is vacuumized and maintained in a predetermined low-pressure state.

Figure 2A:
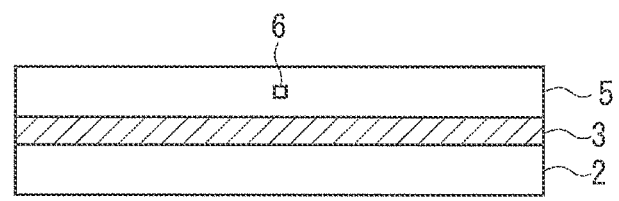
FIG. 2A is a sectional view showing an arrangement of a heater and a temperature sensor according to the first exemplary embodiment.
Figure 2B:
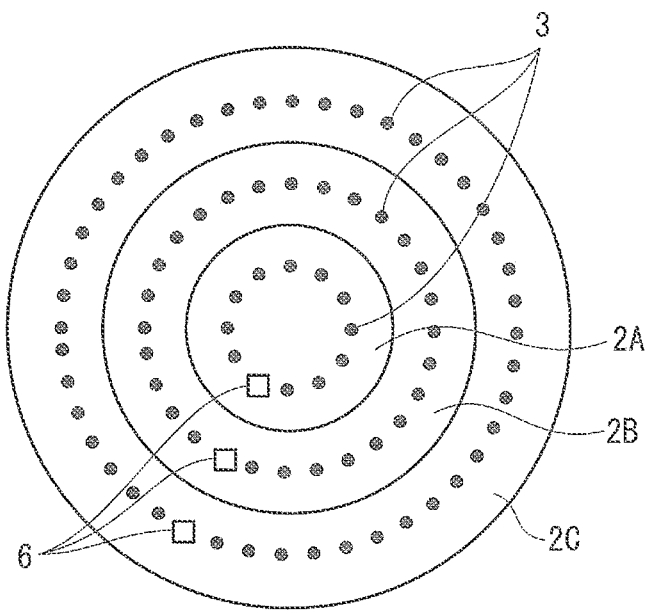
FIG. 2B is a plan view showing an arrangement of the heater and the temperature sensor according to the first exemplary embodiment.

As shown in FIGS. 2A and 2B, the heater 3 includes a plurality of heaters 3 disposed in the stage 2 to adjust the in-plane temperature distribution of the silicon wafer W on the stage 2.

FIG. 2A is a sectional view of the stage 2, showing that a plate 5 is disposed on the heaters 3 on the stage 2. A temperature sensor 6 (a temperature detector) is disposed in the plate 5.

FIG. 2B is a plan view of the stage 2, showing that the stage 2 is divided into three concentric zones 2A, 2B, 2C, in each of which the heaters 3 are disposed. The temperature sensor 6 in the plate 5 includes temperature sensors 6 disposed at positions corresponding to the heaters 3.

The zones 2A, 2B and 2C of the stage 2 can be independently heated by supplying electricity to the heaters 3. Accordingly, the heaters 3 are controlled by adjusting the supply of electricity thereto to adjust the in-plane temperature distribution of the silicon wafer W on the stage 2. The heaters 3 disposed in each of the zones 2A, 2B and 2C are controlled by a controller 24.

[2] Structure of Controller 24

Figure 3:
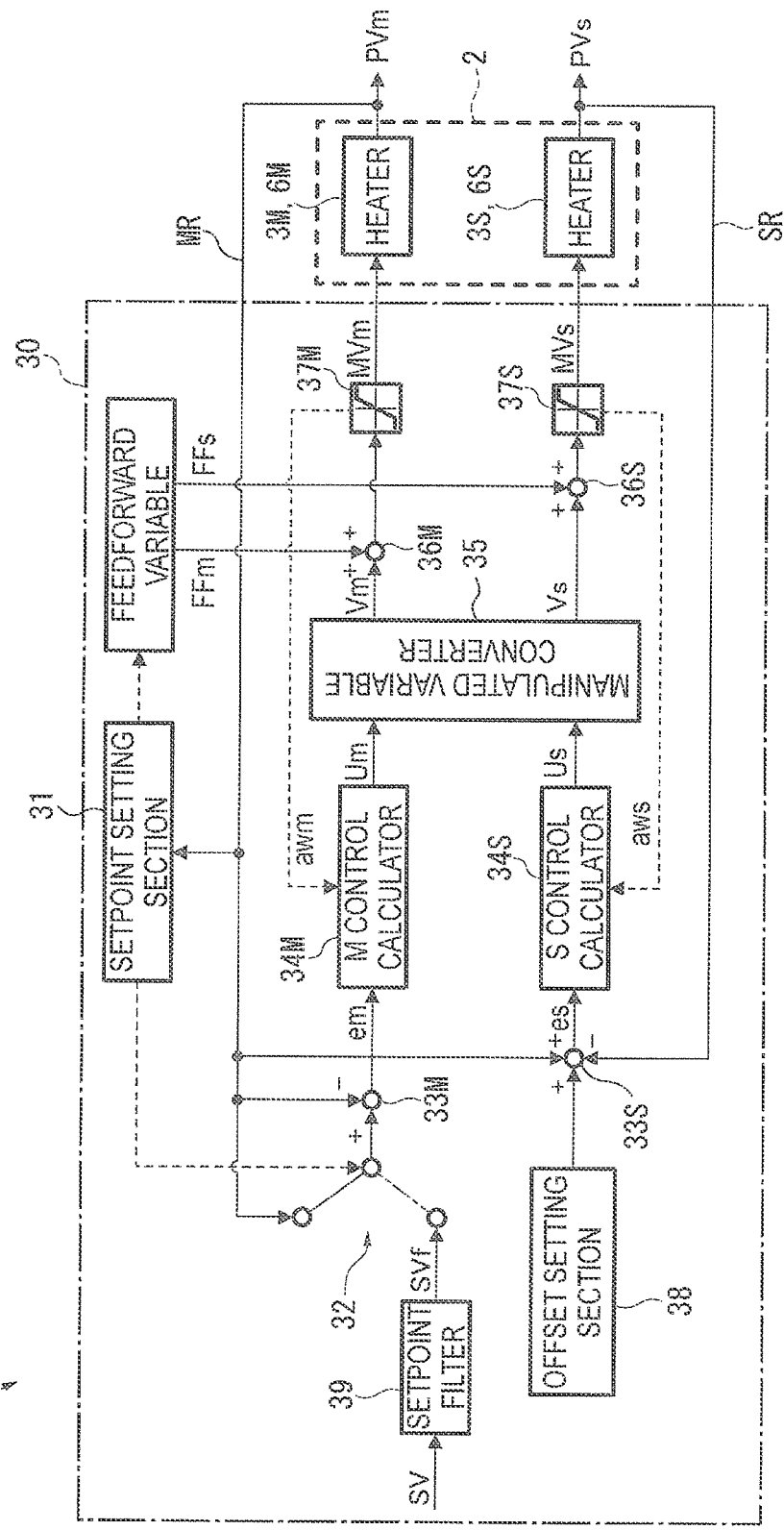
FIG. 3 is a block diagram showing a structure of a controller that controls the temperature adjustment apparatus according to the first exemplary embodiment.

The controller 24 controls the heaters 3, which include master heaters 3M and slave heaters 3S, based on temperatures detected by the temperature sensor 6 as described above, and has a functional structure as shown in a block diagram of FIG. 3.

The controller 24 includes: a master loop MR for controlling the heaters 3M for heating the zone 2A shown in FIGS. 2A and 2B; a slave loop SR for controlling the heaters 3S for heating the zone 2B and the zone 2C; a master temperature sensor 6M that detects the temperatures of the heaters 3M; a slave temperature sensor 6S that detects the temperatures of the heaters 3S; and a manipulated variable calculator 30 that calculates a manipulated variable for each of the master loop MR and the slave loop SR. It should be noted that the slave loop SR includes two loops for the zones 2B, 2C that similarly follow the master loop MR, and thus only one of the loops is shown in FIG. 3.

In a master-slave control system, a control variable for a slave side follows a control variable for a master side to control the temperature distribution. Accordingly, the maximum response speed of the control system is usually limited by a loop with the slowest response speed, so that the loop with the slowest response speed should be defined as the master loop MR.

The manipulated variable calculator 30 applies manipulated variables MVm, MVs based on a master control setpoint SVm and a slave control setpoint SVs to the heaters 3M, 3S, respectively.

The manipulated variable calculator 30 includes: a setpoint setting section 31, a switch 32, a master deviation calculator 33M, a slave deviation calculator 33S, a master control calculator 34M, a manipulated variable converter 35, a master feedforward variable adding section 36M, a slave feedforward variable adding section 36S, a master manipulated variable regulator 37M, a slave manipulated variable regulator 37S, an offset setting section 38 and a setpoint filter 39.

The setpoint setting section 31 monitors a temperature detection value PVm from the temperature sensor 6M of the master loop MR, and switches the switch 32 when the temperature detection value reaches a preset temporary setpoint X (described later). At the start of an operation, the switch 32 is initially set in a first position for setting the temperature detection value PVm from the temperature sensor 6M as the master control setpoint SVm. When determining that the temperature detection value PVm from the temperature sensor 6M reaches the temporary setpoint X, the setpoint setting section 31 switches the switch 32 to a second position for setting an actually preset control setpoint as the master control setpoint SVm. It should be noted that the control setpoint SV may be SVf inputted through the setpoint filter 39.

The setpoint setting section 31 varies a feedforward variable FFm to be added to the master feedforward variable adding section 36M and a feedforward variable FFs to be added to the slave feedforward variable adding section 36S, while monitoring the temperature detection value PVm.

The master deviation calculator 33M calculates a deviation em between the control setpoint SVm inputted through the switch 32 and the temperature detection value PVm from the temperature sensor 6M, and outputs it to the master control calculator 34M.

The slave deviation calculator 33S calculates a deviation es between the slave control setpoint SVs, which is the temperature detection value PVm from the master temperature sensor 6M, and the detection value PVs from the slave temperature sensor 6S, and outputs it to the slave control calculator 34S. When a constant temperature difference is to be provided between the master and the slave, a temperature difference δ is set in the offset setting section 38.

The master control calculator 34M, an example of which is a PID controller, outputs a calculation result Um to the manipulated variable converter 35.

The slave control calculator 34S similarly outputs a calculation result Us to the manipulated variable converter 35.

The manipulated variable converter 35 is configured to convert the inputted calculation result Um from the master control calculator 34M and calculation result Us from the slave control calculator 34S into manipulated variables so that mutual interference between the master loop MR and the slave loop SR is reduced. The two inputs Um, Us are converted into the two outputs Vm, Vs using a transformation matrix H and the thus-obtained master manipulated variables Vm and slave manipulated variable Vs are outputted. The transformation matrix H is obtained from, for instance, a steady-state gain matrix Gp=P(0) and a master-slave manipulated variable transformation matrix Gm, given that a target to be controlled is represented by a transfer function matrix P(s). The transformation matrix H for obtaining the manipulated variables is represented by the following formula (1), given that the transfer function matrix P(s) has two rows and two columns.

$$\begin{bmatrix} V_m \\ V_s \end{bmatrix} = H \cdot \begin{bmatrix} U_m \\ U_s \end{bmatrix} \quad (1)$$

$$= \begin{bmatrix} h_{11} & h_{12} \\ h_{21} & h_{22} \end{bmatrix} \begin{bmatrix} U_m \\ U_s \end{bmatrix}$$

$$H = (Gm \cdot Gp)^{-1}$$

$$Gp = P(0)$$

The master feedforward variable adding section 36M adds the feedforward variable FFm to the master output Vm from the manipulated variable converter 35, whereas the slave feedforward variable adding section 36S adds the feedforward variable FFs to the slave output Vs.

The master manipulated variable regulator 37M regulates the manipulated variable so that the output of the heaters 3M falls within a range from the minimum output to the maximum output thereof. When determining that the manipulated variable reaches a saturation level, the master manipulated variable regulator 37M outputs a corresponding determination signal awm to the master control calculator 34M. The output of the master manipulated variable regulator 37M is outputted as the manipulated variable MVm to the heaters 3M.

Similarly, the slave manipulated variable regulator 37S regulates the manipulated variable so that the output of the heaters 3S falls within a range from the minimum output to the maximum output thereof. When determining that the manipulated variable reaches a saturation level, the slave manipulated variable regulator 37S outputs a corresponding determination signal aws to the slave control calculator 34S. The output of the slave manipulated variable regulator 37S is outputted as the manipulated variable MVs to the heaters 3S. The determination signals awm, aws function as anti-windup activation signals in the master control calculator 34M and the slave control calculator 34S, respectively.

[3] Effects of First Exemplary Embodiment

Figure 4:
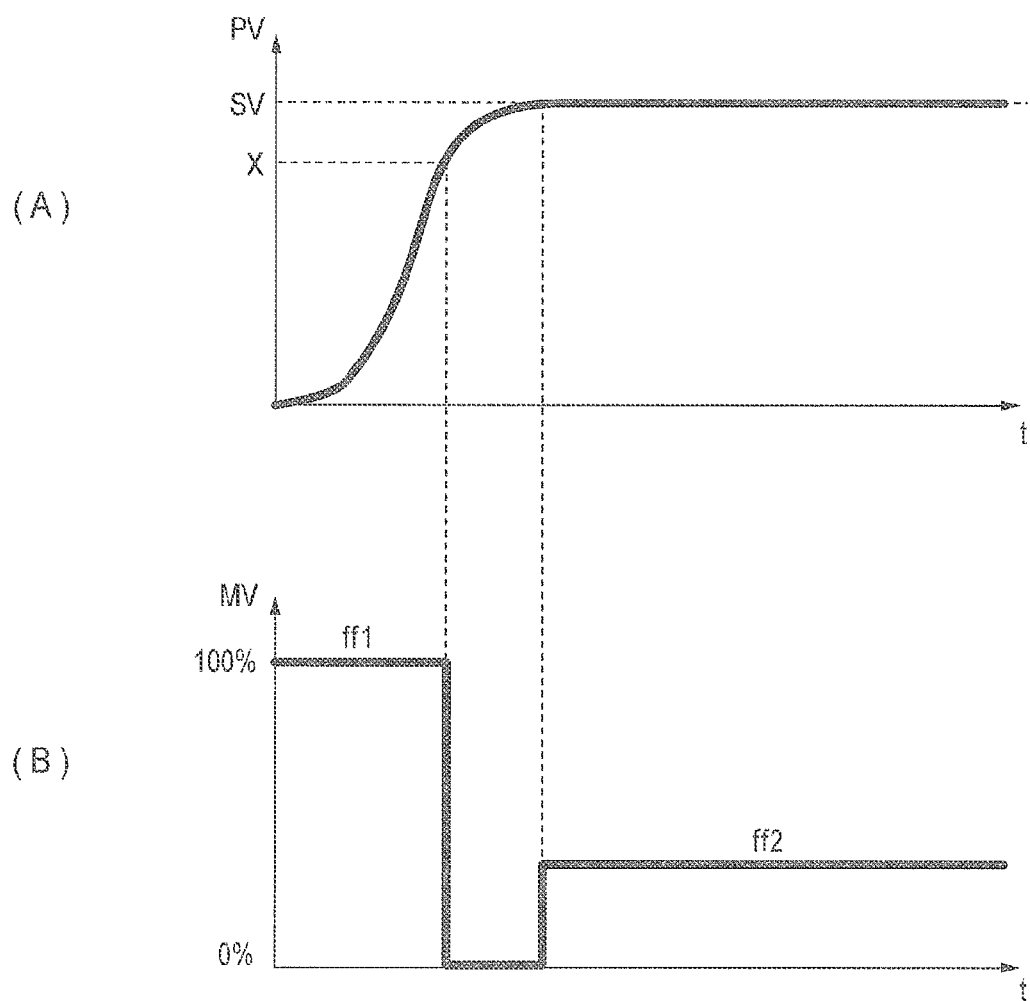
FIG. 4 is graphs for explaining the effects of the first exemplary embodiment, showing a relationship between a control variable PV and a manipulated variable MV.

FIG. 4 shows setpoint responses through a single-input single-output system. FIG. 4(A) shows a temporal variation of the control variable PV and FIG. 4(B) shows a temporal variation of the manipulated variable MV.

In setpoint response through a control system in which the heaters 3M could be saturated, the control setpoint SV can be reached in the shortest time by: saturating the heaters 3M with a manipulated variable $ff_1$, which enables the maximum output of the heaters 3M, so that the temperature is increased at the maximum speed; switching the manipulated variable to zero before the control setpoint SV is reached (the manipulated variable may be set at a minus in the case of using a thermoelectric element capable of heating and cooling); letting the control setpoint SV be automatically reached (the control setpoint SV may be reached with a braking force in the case of a minus manipulated variable); and finally immediately switching the manipulated variable to $ff_2$ enabling the temperature to be settled at the control setpoint SV.

The above operation method is considerably difficult to perform under a feedback control such as a PID control in which a variable is calculated based on a deviation, and thus a feedforward control is suitably employed.

Figure 5:
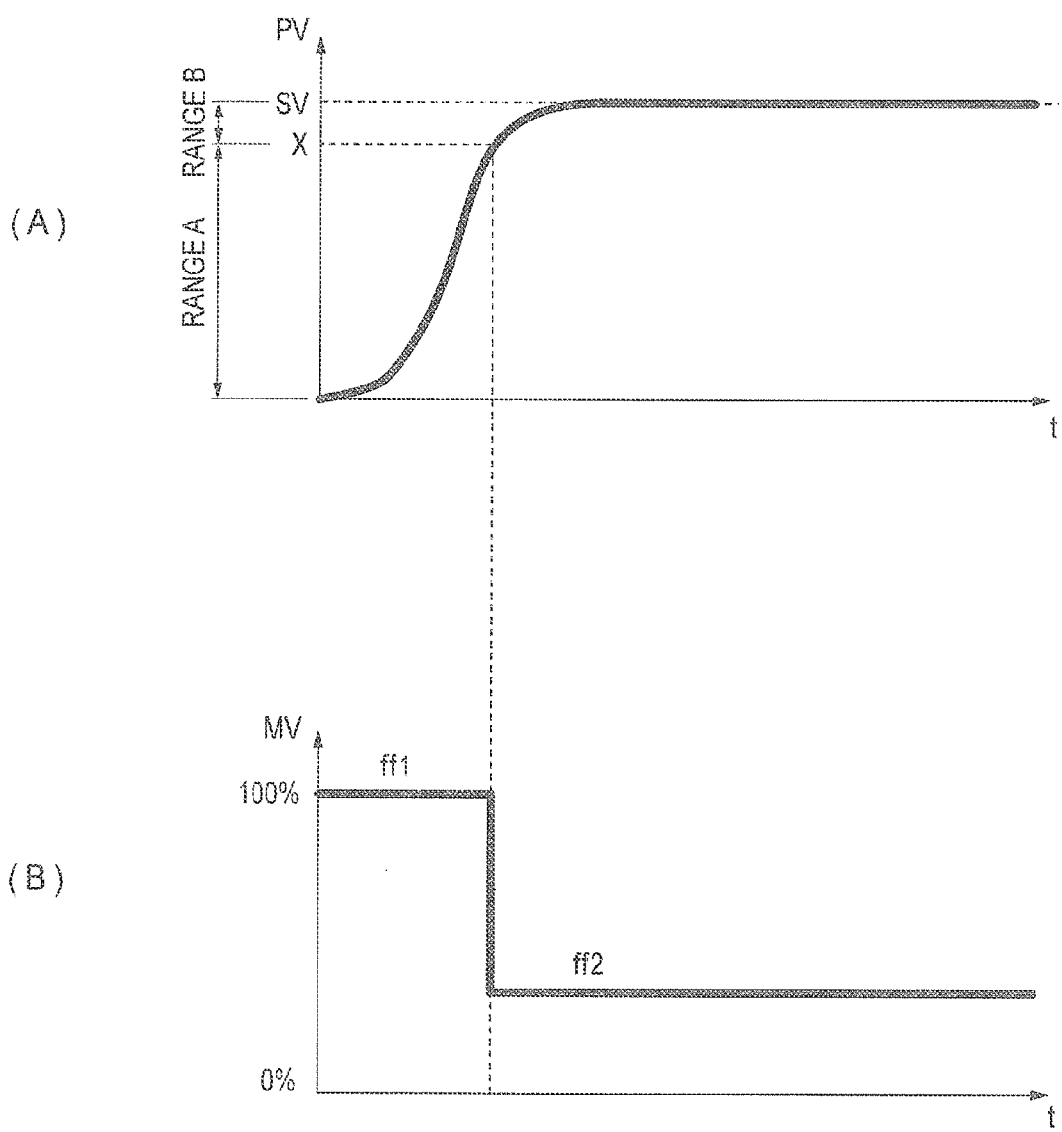
FIG. 5 is graphs for explaining the effects of the first exemplary embodiment, showing a relationship between the control variable PV and the manipulated variable MV.
Figure 8A:
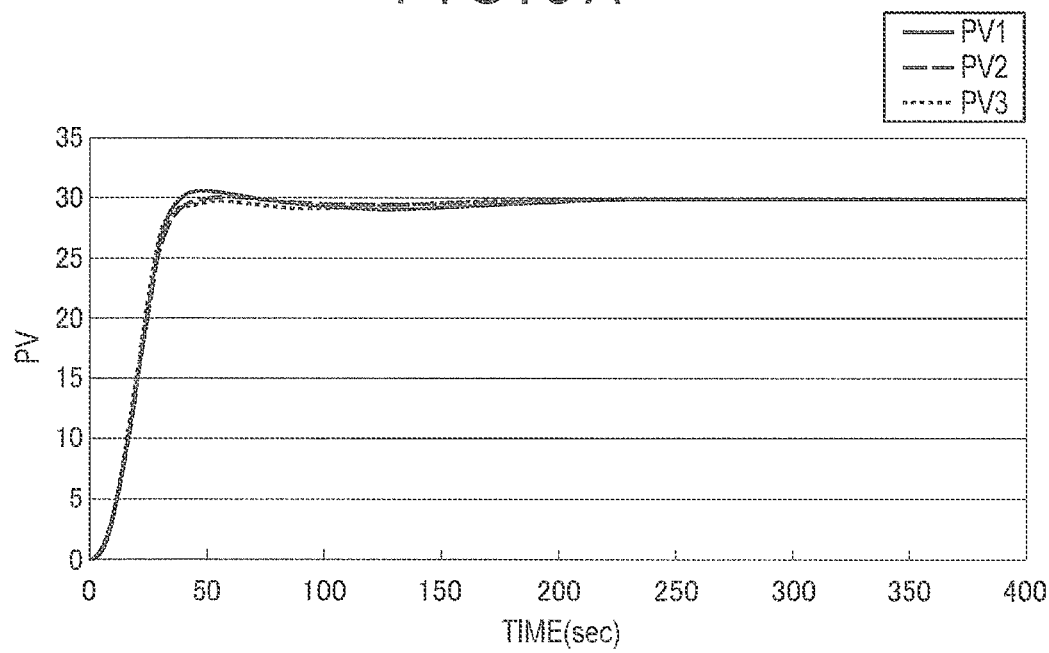
FIG. 8A is a graph for explaining the result of a simulation according to the first exemplary embodiment, showing a variation of the control variable PV (in the case that a target without interference is controlled).
Figure 8B:
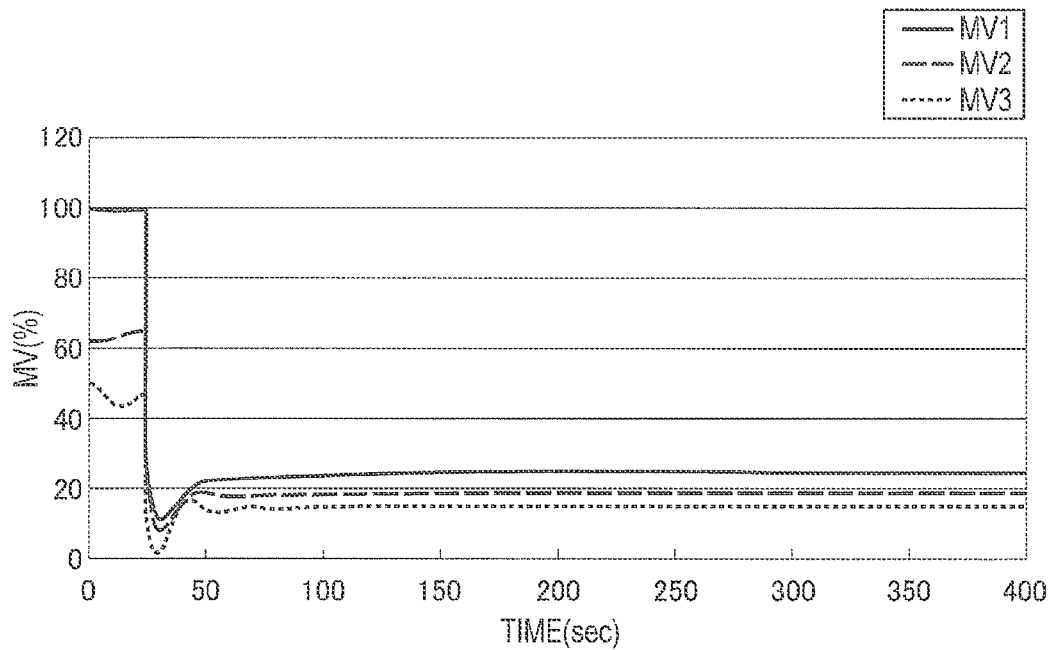
FIG. 8B is a graph for explaining the result of the simulation according to the first exemplary embodiment, showing a variation of the manipulated variable MV (in the case that the target without interference is controlled).
Figure 9A:
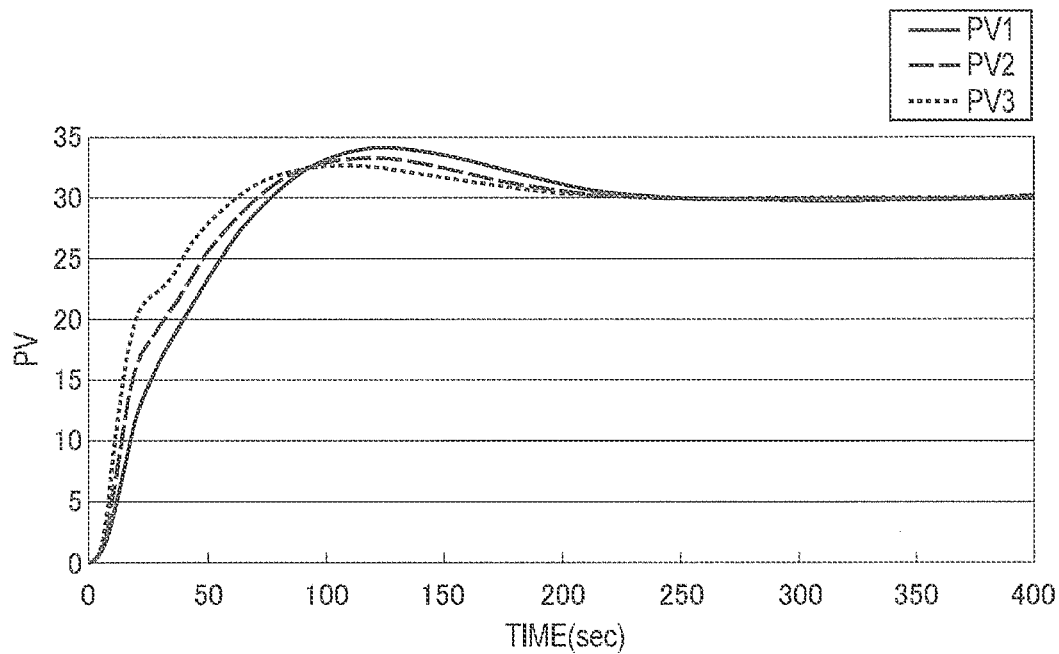
FIG. 9A is a graph for explaining the result of a simulation by a typical method, showing a variation of the control variable PV (in the case that the target without interference is controlled).
Figure 9B:
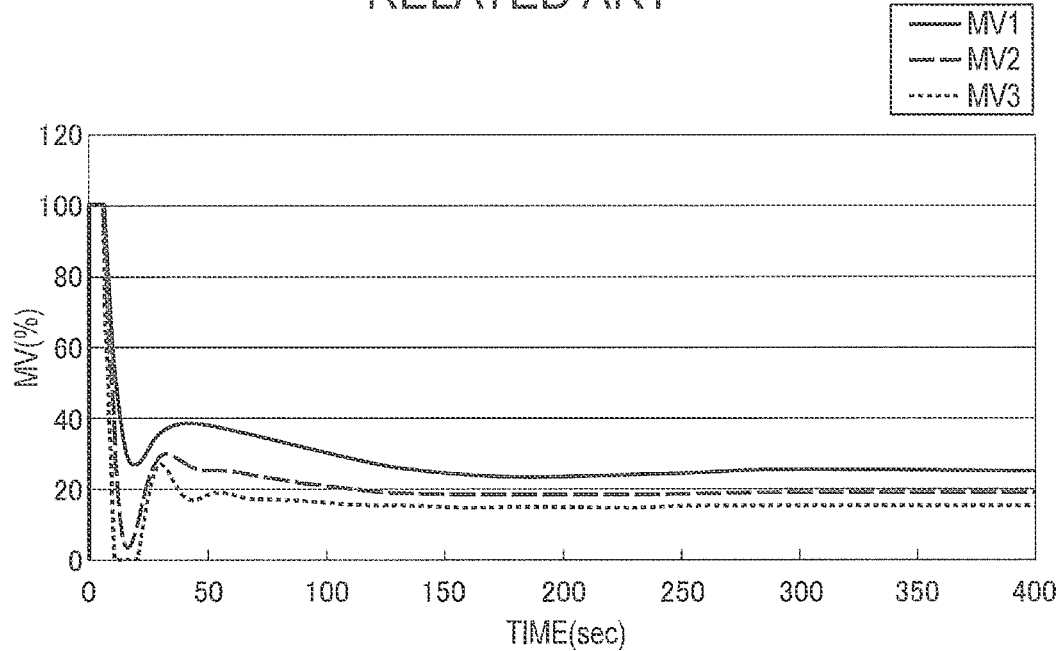
FIG. 9B is a graph for explaining the result of the simulation by the typical method, showing a variation of the manipulated variable MV (in the case that the target without interference is controlled).
Figure 10A:
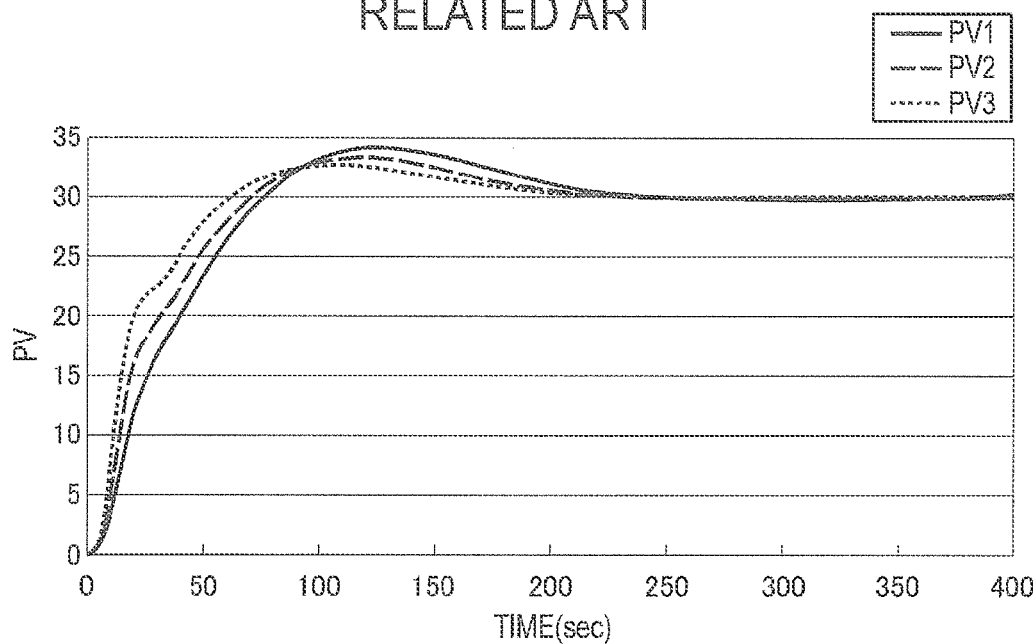
FIG. 10A is a graph for explaining the result of a simulation by a typical gradient temperature control method, showing a variation of the control variable PV (in the case that the target without interference is controlled).
Figure 10B:
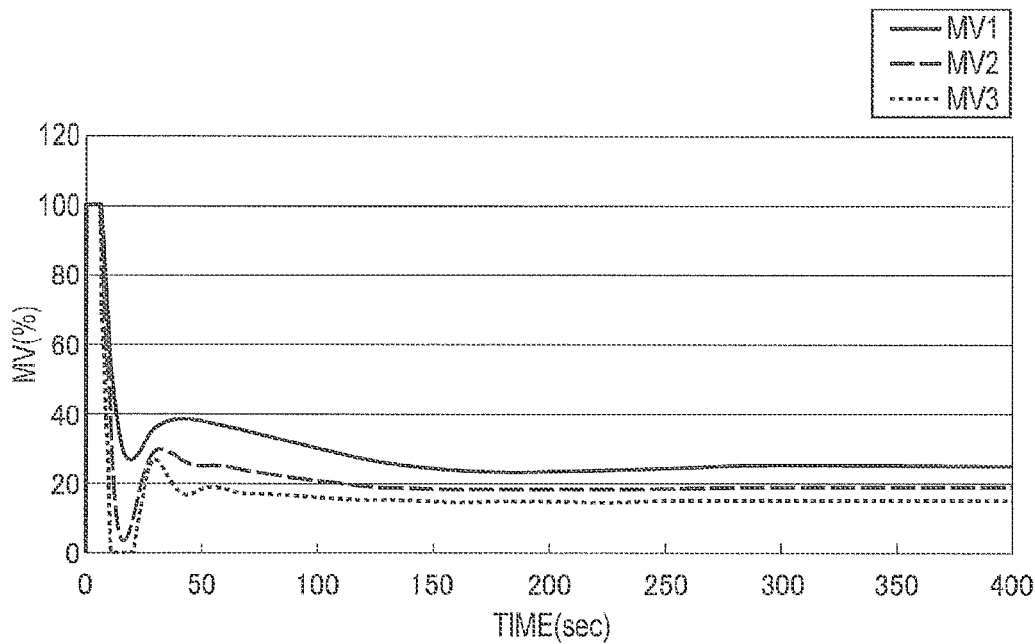
FIG. 10B is a graph for explaining the result of the simulation by the typical gradient temperature control method, showing a variation of the manipulated variable MV (in the case that the target without interference is controlled).

The first exemplary embodiment is based on the above idea. Specifically, as shown in FIG. 5, the setpoint setting section 31 performs a control using the switch 32 to: set the temperature detection value PVm from the temperature sensor 6M as the control setpoint, when the manipulated variable PV is in a range A defined below the temporary setpoint X below the control setpoint SV; and set the actually preset control setpoint or Svf, which is inputted through the setpoint filter 39, as the control setpoint, when the manipulated in a range B over the temporary setpoint X.

As a result, when the temperature detection value PVm is set as the control setpoint SVm, the deviation between the control setpoint SVm and the temperature detection value PVm calculated by the master deviation calculator 33M is zero, so that the sum of the feedforward variable $ff_1$ in the range A and a correction signal (e.g., h12×Us, in the formula (1)) outputted from the slave side through the transformation matrix H is set as the manipulated variable for driving the heaters 3M.

In driving the heaters 3M of the master loop MR with the maximum output, a feedforward variable $ff_{1s}$ for the heaters 3S of the slave loop SR can be calculated using a steady-state gain matrix Gp in the above formula (1).

Specifically, a gain ratio g of an output in response to the input of the manipulated variable MV with the same magnitude can be obtained by the following formula (2).

$$G_p = P(0)$$

$$= \begin{bmatrix} k_{11} & k_{12} \\ k_{21} & k_{22} \end{bmatrix}$$

-continued $$g = \begin{bmatrix} g_1 \\ g_2 \end{bmatrix} \quad (2)$$
$$= \begin{bmatrix} k_{11} & k_{12} \\ k_{21} & k_{22} \end{bmatrix} \cdot \begin{bmatrix} 1 \\ 1 \end{bmatrix}$$
$$= \begin{bmatrix} k_{11} + k_{12} \\ k_{21} + k_{22} \end{bmatrix}$$

Let $$G_p = P(0)$$
$$= \begin{bmatrix} k_{11} & k_{12} \\ k_{21} & k_{22} \end{bmatrix}$$

Then $$g = \begin{bmatrix} g_1 \\ g_2 \end{bmatrix} \quad (2)$$
$$= \begin{bmatrix} k_{11} & k_{12} \\ k_{21} & k_{22} \end{bmatrix} \cdot \begin{bmatrix} 1 \\ 1 \end{bmatrix}$$
$$= \begin{bmatrix} k_{11} + k_{12} \\ k_{21} + k_{22} \end{bmatrix}$$

Therefore, when $g_2 > g_1$, $ff_{1m} = 100\%$ (master side)

$ff_{1s} = 100 \times (k_{11}+k_{12})/(k_{21}+k_{22})\%$ (slave side)

On the other hand, when $g_2 < g_1$, $ff_{1m} = 100 \times (k_{21}+k_{22})/(k_{11}+k_{12})\%$ (master side)

$ff_{1s} = 100\%$ (slave side)

The above values are set as initial values and adjusted by simulation, experiment with actual equipment, or the like.

A master feedforward variable $ff_{2m}$ and a slave feedforward variable $ff_{2s}$ in the range B are calculated as follows. When outputs in response to the input of the manipulated variable MV are equally the setpoint SV to be finally achieved, an input-output relationship in a steady state is represented by the following formula (3) using the steady-state gain matrix Gp.

$$\begin{bmatrix} SV \\ SV \end{bmatrix} = \begin{bmatrix} k_{11} & k_{12} \\ k_{21} & k_{22} \end{bmatrix} \cdot \begin{bmatrix} MV_m \\ MV_s \end{bmatrix} \quad (3)$$

Therefore, the master feedforward variable $ff_{2m}$ and the slave feedforward variable $ff_{2s}$ are equal to the manipulated variable in the steady state and thus can be calculated by the following formula (4).

$$\begin{bmatrix} ff_{2m} \\ ff_{2m} \end{bmatrix} = \begin{bmatrix} k_{11} & k_{12} \\ k_{21} & k_{22} \end{bmatrix}^{-1} \cdot \begin{bmatrix} SV \\ SV \end{bmatrix} \quad (4)$$

A trial-and-error approach such as simulation or experiment with actual equipment is required to determine the temporary setpoint X. In switching the setpoint from X to SV in the range B, it is preferable that the setpoint should be gradually changed through the setpoint filter 39 to the setpoint to be finally achieved because a drastic change of the setpoint is accompanied by a drastic change of the manipulated variable, which may result in an unfavorable influence on the control. For instance, a first order lag filter is used as the setpoint filter 39, but it is not requisite. A trial-and-error approach is also required to determine a filter time constant. In the case of using a first order lag filter with a time constant of Tf seconds, $SV_f$ is represented by the following formula (5).

$$SV_f = \frac{1}{T_f s + 1} SV \quad (5)$$

It should be noted that the ranges are defined on a basis of temperature in the first exemplary embodiment, but may be defined on a basis of a combination of temperature and time.

Next, a specific process of the first exemplary embodiment will be described with reference to a flow chart shown in FIG. 6.

First, the setpoint setting section 31 sets the temperature detection value PVm detected by the temperature sensor 6 as the setpoint SVm (step S1), and starts driving of the heaters 3M of the master loop MR under a feedforward control mainly based on the feedforward variable $ff_{1m}$ (step S2). Simultaneously, the setpoint setting section 31 starts driving of the slave loop SR under a feedforward control based on the feedforward variable $ff_{1s}$ and a feedback control based on a slave deviation es (step S3).

The setpoint setting section 31 monitors the temperature detection value PVm detected by the temperature sensor 6 and determines whether or not the temporary setpoint X is reached (step S4).

When the temporary setpoint X is determined to be reached, the setpoint setting section 31 sets the actually preset control setpoint SV or SVf, which is inputted through the setpoint filter 39, as the master control setpoint SVm using the switch 32 (step S5), and starts the feedback control of the master heaters 3M based on the feedforward control based on the feedforward variable $ff_{2m}$ and the feedback control based on the master deviation em (step S6). The setpoint setting section 31 starts driving of the slave heaters 3S based on the feedforward variable $ff_{2s}$ and the slave deviation es (step S7).

[4] Second Exemplary Embodiment

Next, a second exemplary embodiment of the invention will be described. It should be noted that, in the following description, parts and the like identical to those described above are attached with the same reference signs and the explanation thereof is omitted.

In the first exemplary embodiment, when the temporary setpoint X is reached, the manipulated variable is immediately switched from the feedforward variable $ff_1$ to the feedforward variable $ff_2$ as shown in FIG. 5.

In contrast, the second exemplary embodiment is different from the first exemplary embodiment in that the manipulated variable is switched as shown in FIG. 7.

Specifically, in the second exemplary embodiment, the range A is further divided into a plurality of ranges and feedforward variables are switched in accordance with these ranges to achieve a further minute control as shown in FIG. 7(B). The second exemplary embodiment is different from the first exemplary embodiment in that the range A is divided into a range A0 and a range A1 with reference to the temporary setpoint Y, and the feedforward variables $ff_{m10}$, $ff_{s10}$ are added in the range A0 whereas the feedforward variables $ff_{m11}$, $ff_{s11}$ are added in the range A1.

The second exemplary embodiment can provide effects similar to those of the first exemplary embodiment.

[5] Demonstration of Effects of Invention

In order to demonstrate the effects of the invention, the method according to the first exemplary embodiment, a typical master-slave control method and the gradient temperature control method disclosed in the publication of Japanese Patent No. 3278807 were each applied to the heaters 3M, 3S (a three-input three-output system), and the resulting setpoint responses were compared.

[5-1] Target without Interference to be Controlled

A transfer function of the heaters 3 (a target to be controlled) was represented by the following formula (6).

$$\begin{bmatrix} y_1 \\ y_2 \\ y_3 \end{bmatrix} = \begin{bmatrix} \frac{1.2 \exp(-2s)}{(70s+1)(10s+1)} & 0 & 0 \\ 0 & \frac{1.6 \exp(-2s)}{(60s+1)(10s+1)} & 0 \\ 0 & 0 & \frac{2.0 \exp(-2s)}{(50s+1)(10s+1)} \end{bmatrix} \begin{bmatrix} u_1 \\ u_2 \\ u_3 \end{bmatrix} \quad (6)$$

The steady-state gain matrix Gp of this target was represented by the following formula (7).

$$G_p = \begin{bmatrix} 1.2 & 0 & 0 \\ 0 & 1.6 & 0 \\ 0 & 0 & 2 \end{bmatrix} \quad (7)$$

The gain ratio g was calculated by the above formula. When an arbitrary value such as 1 was assigned, the gain ratio g was represented by the following formula (8).

$$g = \begin{bmatrix} g_1 \\ g_2 \\ g_3 \end{bmatrix} \quad (8)$$

$$= G_p^{-1} \begin{bmatrix} 1 \\ 1 \\ 1 \end{bmatrix}$$

$$= \begin{bmatrix} 1.2 & 0 & 0 \\ 0 & 1.6 & 0 \\ 0 & 0 & 2 \end{bmatrix}^{-1} \begin{bmatrix} 1 \\ 1 \\ 1 \end{bmatrix}$$

$$= \begin{bmatrix} 0.833 \\ 0.625 \\ 0.5 \end{bmatrix}$$

Based on the above ratio, the feedforward variable in the range A was determined as $ff_1 = [100\ 75\ 60](\%)$ based on $ff_{1m}$, $ff_{1s}$ calculated by the formula (2).

The feedforward variable $ff_2$ in the range B was represented by the following formula (9) when the setpoint was, for instance, 30.

$$ff_2 = G_p^{-1} \begin{bmatrix} 30 \\ 30 \\ 30 \end{bmatrix} \quad (9)$$

$$= \begin{bmatrix} 1.2 & 0 & 0 \\ 0 & 1.6 & 0 \\ 0 & 0 & 2 \end{bmatrix}^{-1} \begin{bmatrix} 30 \\ 30 \\ 30 \end{bmatrix}$$

$$= \begin{bmatrix} 25 \\ 18.8 \\ 15 \end{bmatrix} (\%)$$

A PID controller was used as the controller and the manipulated variable (%) was set at a value calculated by the following formula (10). It should be noted that Pb represents a proportional range, Ti represents an integral time, and Td represents a derivative time.

$$MV_n = \frac{100}{Pb_n}\left(1 + \frac{1}{Ti_n s} + \frac{Td_n s}{Td_n s/10 + 1}\right)e_n \quad n = 1\ldots 3 \quad (10)$$

After the above preparation was done, a simulation by the method according to the first exemplary embodiment, a simulation by the typical master-slave method and a simulation by the gradient temperature control method disclosed in Japanese Patent No. 3278807 were performed. The results of the above simulations are respectively shown in FIGS. 8A and 8B, FIGS. 9A and 9B, and FIGS. 10A and 10B.

It should be noted that PID constants used in any of the above simulations were as follows.

MV1, PV1: Pb=100, Ti=35, Td=20
MV2, PV2: Pb=40, Ti=35, Td=20
MV3, PV3: Pb=40, Ti=35, Td=20

As a result of the above comparison, it is proved that the method according to the first exemplary embodiment achieves early rise time and excellent uniformity.

[5-2] Target with Interference to be Controlled

Next, regarding a target with interference to be controlled, the method according to claim 1, the typical master-slave method and the gradient temperature control method disclosed in Japanese Patent No. 3278807 were compared.

Specifically, it was assumed that an aluminum plate as shown in FIG. 11 was heated using heating elements (resistance) at three spots (Z1 to Z3). From the result of an experiment on dynamic characteristics, the transfer function of the target to be controlled was represented by the following formula (11).

$$\begin{bmatrix} y_1 \\ y_2 \\ y_3 \end{bmatrix} = \begin{bmatrix} \frac{42.7 \exp(-2s)}{(297s+1)} & \frac{22.2 \exp(-2s)}{(432s+1)} & \frac{19.6 \exp(-2s)}{(484s+1)} \\ \frac{22.8 \exp(-2s)}{(434s+1)} & \frac{36.9 \exp(-2s)}{(305s+1)} & \frac{32.5 \exp(-2s)}{(383s+1)} \\ \frac{16.0 \exp(-2s)}{(476s+1)} & \frac{31.7 \exp(-2s)}{(352s+1)} & \frac{46.0 \exp(-2s)}{(290s+1)} \end{bmatrix} \begin{bmatrix} u_1 \\ u_2 \\ u_3 \end{bmatrix} \quad (11)$$

The steady-state gain matrix Gp of the heating elements (the target) was represented by the following formula (12).

$$G_p = \begin{bmatrix} 42.7 & 22.2 & 19.6 \\ 22.8 & 36.9 & 32.5 \\ 16.0 & 31.7 & 46.0 \end{bmatrix} \quad (12)$$

The gain ratio g was calculated by the above formula. When an arbitrary value such as 1 was assigned, the gain ratio g was represented by the following formula (13).

$$g = \begin{bmatrix} g_1 \\ g_2 \\ g_3 \end{bmatrix} = \begin{bmatrix} 42.7 & 22.2 & 19.6 \\ 22.8 & 36.9 & 32.5 \\ 16.0 & 31.7 & 46.0 \end{bmatrix} \begin{bmatrix} 1 \\ 1 \\ 1 \end{bmatrix} = \begin{bmatrix} 84.5 \\ 92.2 \\ 93.7 \end{bmatrix} \quad (13)$$

Based on the above ratio, the feedforward variable in the range A was determined as $ff_1=[100\ 92\ 90](\%)$.

The feedforward variable $ff_2(\%)$ in the range B was represented by the following formula (14) when the setpoint was, for instance, 40.

$$ff_2 = G_p^{-1} \begin{bmatrix} 40 \\ 40 \\ 40 \end{bmatrix} = \begin{bmatrix} 42.7 & 22.2 & 19.6 \\ 22.8 & 36.9 & 32.5 \\ 16.0 & 31.7 & 46.0 \end{bmatrix}^{-1} \begin{bmatrix} 40 \\ 40 \\ 40 \end{bmatrix} = \begin{bmatrix} 0.549 \\ 0.374 \\ 0.421 \end{bmatrix} \Rightarrow \begin{bmatrix} 54.9 \\ 37.4 \\ 42.1 \end{bmatrix} (\%) \quad (14)$$

The feedforward variable $ff_1$ was switched to the feedforward variable $ff_2$ at y1=37 degrees C. The temperature setpoint was changed from 37 degrees C. to 40 degrees C. through a first order lag filter with a time constant of 20 seconds.

A PID controller was used as the controller and the manipulated variable (%) was set at a value calculated by the following formula (10).

PID constants used in any of the above simulations were as follows.

MV1, PV1: Pb=3.3, Ti=100, Td=0
MV2, PV2: Pb=3.3, Ti=100, Td=0
MV3, PV3: Pb=3.3, Ti=100, Td=0

A non-interfering matrix as represented by the following formula (15) was obtained by a commonly known method.

$$Gp = \begin{bmatrix} 0.9582 & 0.3426 & 0.2699 \\ 0.3502 & 0.8064 & 0.5656 \\ 0.2241 & 0.6003 & 1.0572 \end{bmatrix} \quad (15)$$

A manipulated variable transformation matrix for master-slave was represented by the following formula (16).

$$Gm = \begin{bmatrix} 1 & 0 & 0 \\ -1 & 1 & 0 \\ -1 & 0 & 1 \end{bmatrix} \quad (16)$$

A manipulated variable transformation matrix for the gradient temperature control method is represented by the following formula (17).

$$Gm2 = \begin{bmatrix} 1/3 & 1/3 & 1/3 \\ -1 & 1 & 0 \\ 0 & -1 & 1 \end{bmatrix} \quad (17)$$

A transformation matrix H1 obtained by combining the non-interfering matrix represented by the formula (15) and the manipulated variable transformation matrix was represented by the following formula (18) in the case of master-slave.

$$H1 = (Gm \cdot Gp)^{-1} = \begin{bmatrix} 0.6944 & -0.4809 & -0.0575 \\ 0.6287 & 2.2892 & -1.0754 \\ 0.4417 & -1.1979 & 1.5687 \end{bmatrix} \quad (18)$$

A transformation matrix H2 obtained by combining the non-interfering matrix and the manipulated variable transformation matrix for the gradient temperature control method was represented by the following formula (19).

$$H2 = (Gm2 \cdot Gp)^{-1} = \begin{bmatrix} 0.6944 & -1.0013 & -0.2890 \\ 0.6287 & 0.7947 & -1.2850 \\ 0.4417 & 0.0763 & 1.4214 \end{bmatrix} \quad (19)$$

After the above preparation was done, a simulation by the method according to the first exemplary embodiment, a simulation by the typical master-slave method and a simulation by the gradient temperature control method disclosed in Japanese Patent No. 3278807 were performed. The results of the above simulations are respectively shown in FIGS. 12A and 12B, FIGS. 13A and 13B, and FIGS. 14A and 14B.

As a result, it is proved that the method according to the first exemplary embodiment achieves early rise time and excellent uniformity irrespective of whether or not the target to be controlled suffers interference.

What is claimed is:

1. A temperature controller for a semiconductor wafer, the temperature controller performing a temperature control on a plurality of temperature adjusters including a reference temperature adjuster to adjust a temperature of the semiconductor wafer, the temperature controller comprising:
   a master loop, controlling a temperature of the reference temperature adjuster;
   at least one slave loop, following the master loop to control a temperature of rest of the temperature adjusters;
   a master temperature detector, detecting the temperature of the semiconductor wafer having been adjusted by the reference temperature adjuster;
   a slave temperature detector, detecting the temperature of the semiconductor wafer having been adjusted by the rest of the temperature adjusters; and
   a manipulated variable calculator, calculating, from the temperature detected by the master temperature detector and the temperature detected by the slave temperature detector, a manipulated variable for the reference temperature adjuster and a manipulated variable for the rest of the temperature adjusters, the manipulated variable calculator comprising:

a setpoint setting section, setting as a control setpoint for the reference temperature adjuster an actual control setpoint preset as a desired temperature of the semiconductor wafer or a value equal to the temperature detected by the master temperature detector;

a master deviation calculator, calculating a deviation between the control setpoint set by the setpoint setting section and the temperature detected by the master temperature detector;

a slave deviation calculator, calculating a deviation between the temperature detected by the master temperature detector and the temperature detected by the slave temperature detector;

a master control calculator, receiving the deviation calculated by the master deviation calculator to calculate the manipulated variable for the reference temperature adjuster;

a slave control calculator, receiving the deviation calculated by the slave deviation calculator to calculate the manipulated variable for the rest of the temperature adjusters;

a manipulated variable converter, outputting the manipulated variable calculated by the master control calculator and the manipulated variable calculated by the slave control calculator respectively to the reference temperature adjuster and the rest of the temperature adjusters after converting the manipulated variable calculated by the master control calculator and the manipulated variable calculated by the slave control calculator so that interference between the master loop and the slave loop is reduced; and a feedforward variable adding section, adding a predetermined feedforward variable corresponding to an output from the manipulated variable converter, wherein the setpoint setting section: sets the temperature detected by the master temperature detector as the control setpoint for the reference temperature adjuster, until a temporary setpoint below the actual control setpoint is reached; and sets the actual control setpoint as the control setpoint for the reference temperature adjuster after the temporary setpoint is reached.

2. The temperature controller for the semiconductor wafer according to claim 1, wherein the temporary setpoint comprises a plurality of temporary setpoints.

3. The temperature controller for the semiconductor wafer according to claim 1, wherein it is determined whether or not the temporary setpoint is reached on a basis of at least one of temperature and time.

4. A temperature control method for a semiconductor wafer, the temperature control method performing a temperature control on a plurality of temperature adjusters including a reference temperature adjuster to adjust a temperature of the semiconductor wafer, the plurality of temperature adjusters being controlled by a temperature control system, the temperature control system comprising:

a master loop, controlling a temperature of the reference temperature adjuster;

at least one slave loop, controlling a temperature of rest of the temperature adjusters; and a manipulated variable calculator, applying a manipulated variable to each of the reference temperature adjuster and the rest of the temperature adjusters, the manipulated variable calculator comprising:

a setpoint setting section, setting as a control setpoint for the reference temperature adjuster an actual control setpoint preset as a desired temperature of the semiconductor wafer or a value equal to the temperature detected by a master temperature detector that detects the temperature of the semiconductor wafer having been adjusted by the reference temperature adjuster;

a master deviation calculator, calculating a deviation between the control setpoint set by the setpoint setting section and the temperature detected by the master temperature detector, a slave deviation calculator, calculating a deviation between the temperature detected by the master temperature detector and the temperature detected by a slave temperature detector that detects the temperature of the semiconductor wafer having been adjusted by the rest the of temperature adjusters, a master control calculator, receiving the deviation calculated by the master deviation calculator to calculate the manipulated variable for the reference temperature adjuster, a slave control calculator, receiving the deviation calculated by the slave deviation calculator to calculate the manipulated variable for the rest of the temperature adjusters, and a manipulated variable converter, outputting the manipulated variable calculated by the master control calculator and the manipulated variable calculated by the slave control calculator respectively to the reference temperature adjuster and the rest of the temperature adjusters after converting the manipulated variable calculated by the master control calculator and the manipulated variable calculated by the slave control calculator so that interference between the master loop and the slave loop is reduced;

the temperature control method being performed by the manipulated variable calculator, the temperature control method comprising:

setting, as a control setpoint for the master loop, a temperature detection value of the semiconductor wafer having been subjected to a temperature adjustment by the temperature adjusters;

performing the temperature control of the temperature adjusters based on a preset feedforward variable;

determining whether or not a temporary setpoint below an actually preset control setpoint to be finally achieved is reached;

switching the control setpoint for the master loop to the control setpoint to be finally achieved, when the temporary setpoint is determined to be reached; and performing a feedback control in combination with a feedforward control based on a preset feedforward variable.

* * * * *